(12) United States Patent
Peterson et al.

(10) Patent No.: US 10,183,355 B2
(45) Date of Patent: Jan. 22, 2019

(54) WELDING SYSTEM PANELS

(71) Applicant: Illinois Tool Works Inc., Glenview, IL (US)

(72) Inventors: Ryan Lawrence Peterson, Appleton, WI (US); Nicholas James Dessart, Appleton, WI (US); Sunil Kumar Pattnaik, Appleton, WI (US)

(73) Assignee: Illinois Tool Works Inc., Glenview, IL (US)

( * ) Notice: Subject to any disclaimer, the term of this patent is extended or adjusted under 35 U.S.C. 154(b) by 237 days.

(21) Appl. No.: 13/839,489

(22) Filed: Mar. 15, 2013

(65) Prior Publication Data

US 2014/0069903 A1    Mar. 13, 2014

Related U.S. Application Data

(60) Provisional application No. 61/697,998, filed on Sep. 7, 2012, provisional application No. 61/698,020, filed on Sep. 7, 2012, provisional application No. 61/698,027, filed on Sep. 7, 2012, provisional application No. 61/698,060, filed on Sep. 7, 2012.

(51) Int. Cl.
*B23K 9/10* (2006.01)
*B23K 9/32* (2006.01)
*B23K 37/02* (2006.01)
*A47B 96/06* (2006.01)
*H05K 5/02* (2006.01)

(52) U.S. Cl.
CPC .............. *B23K 9/327* (2013.01); *A47B 96/06* (2013.01); *B23K 9/1006* (2013.01); *B23K 37/02* (2013.01); *H05K 5/023* (2013.01)

(58) Field of Classification Search
CPC .......... B23K 9/10; B23K 9/32; B23K 9/1006; B23K 9/327
USPC ...................... 219/136, 133, 137.7
See application file for complete search history.

(56) References Cited

U.S. PATENT DOCUMENTS

| | | | |
|---|---|---|---|
| 2,871,440 A | 1/1959 | Hart |
| 2,916,733 A | 12/1959 | Hirsch |
| 3,335,468 A | 8/1967 | Harley |
| 5,050,760 A | 9/1991 | Garcia |
| 5,078,614 A | 1/1992 | Shotey |
| 5,106,248 A | 4/1992 | Harris |
| 5,169,218 A | 12/1992 | Chu |

(Continued)

FOREIGN PATENT DOCUMENTS

| | | |
|---|---|---|
| CN | 2289360 | 8/1998 |
| CN | 2616329 | 5/2004 |

(Continued)

OTHER PUBLICATIONS

International Search Report from PCT application No. Pc/US2013/058347 dated Apr. 30, 2014, 15 pgs.

(Continued)

*Primary Examiner* — Dana Ross
*Assistant Examiner* — Ayub Maye
(74) *Attorney, Agent, or Firm* — McAndrews, Held & Malloy, Ltd.

(57) ABSTRACT

A welding system includes an enclosure frame. The welding system also includes a side panel having a tab extending along a bottom edge of the side panel. The tab is configured to mate with a complementary slot in the enclosure frame.

11 Claims, 11 Drawing Sheets

(56) References Cited

U.S. PATENT DOCUMENTS

| | | | |
|---|---|---|---|
| 5,317,795 A | 6/1994 | Bolton | |
| 5,444,897 A | 8/1995 | Gross | |
| 5,607,608 A | 3/1997 | Feldhausen | |
| 5,642,260 A | 6/1997 | Sigl | |
| 5,734,148 A * | 3/1998 | Latvis | B23K 9/32 219/133 |
| 5,747,773 A | 5/1998 | Griffin | |
| 5,797,639 A | 8/1998 | Zorzenon | |
| 5,932,845 A | 8/1999 | Lacy | |
| 6,039,500 A | 3/2000 | Kwon | |
| 6,062,663 A | 5/2000 | You | |
| 6,129,429 A | 10/2000 | Hardt | |
| 6,132,019 A | 10/2000 | Kim | |
| 6,232,576 B1 | 5/2001 | Bankstahl | |
| 6,242,691 B1 | 6/2001 | Reese | |
| 6,489,591 B1 | 12/2002 | Achtner | |
| 6,721,183 B1 * | 4/2004 | Chen et al. | 361/726 |
| 6,764,259 B1 | 7/2004 | Preta | |
| 7,039,439 B2 | 5/2006 | Lee | |
| 7,288,740 B2 * | 10/2007 | Radtke | 219/130.1 |
| 7,306,273 B2 | 12/2007 | Estes | |
| 7,455,373 B2 * | 11/2008 | Bender | B23K 9/32 219/133 |
| 7,456,373 B2 * | 11/2008 | Andersen et al. | 219/130.1 |
| 7,511,219 B2 | 3/2009 | Dinh | |
| 8,070,242 B2 | 12/2011 | Makabe | |
| 8,238,118 B2 | 8/2012 | Li | |
| 2002/0074911 A1 | 6/2002 | Chen | |
| 2002/0135192 A1 | 9/2002 | William | |
| 2003/0011287 A1 | 1/2003 | Searby | |
| 2003/0081399 A1 | 5/2003 | Davis et al. | |
| 2003/0098383 A1 | 5/2003 | Luo | |
| 2003/0136773 A1 | 7/2003 | Bogner | |
| 2003/0155339 A1 * | 8/2003 | Gitter et al. | 219/133 |
| 2004/0196623 A1 | 10/2004 | Erickson et al. | |
| 2005/0023943 A1 * | 2/2005 | Fan et al. | 312/223.2 |
| 2006/0238973 A1 | 10/2006 | Sun | |
| 2008/0116177 A1 * | 5/2008 | Hutchison et al. | 219/75 |
| 2008/0174946 A1 * | 7/2008 | Chen | G06F 1/181 361/679.57 |
| 2010/0084387 A1 * | 4/2010 | Bender et al. | 219/133 |
| 2010/0147817 A1 * | 6/2010 | Laitala et al. | 219/133 |
| 2010/0224607 A1 * | 9/2010 | Hutchison et al. | 219/130.21 |
| 2011/0017717 A1 | 1/2011 | Farah | |
| 2011/0180517 A1 | 7/2011 | Schneider | |
| 2011/0220627 A1 | 9/2011 | Buday | |
| 2011/0297414 A1 * | 12/2011 | Chen et al. | 174/50 |
| 2012/0017819 A1 | 1/2012 | Cleveland | |
| 2013/0146596 A1 * | 6/2013 | Chen | G06F 1/181 220/262 |
| 2014/0070683 A1 | 3/2014 | Peterson | |

FOREIGN PATENT DOCUMENTS

| | | |
|---|---|---|
| CN | 2641991 | 9/2004 |
| CN | 2739926 | 11/2005 |
| CN | 2745428 | 12/2005 |
| CN | 101277003 | 10/2008 |
| CN | 201226132 | 4/2009 |
| CN | 201491982 | 6/2010 |
| CN | 201566881 | 9/2010 |
| CN | 201644419 | 11/2010 |
| CN | 201755727 | 3/2011 |
| CN | 102232726 | 11/2011 |
| CN | 202043391 | 11/2011 |
| CN | 102271474 | 12/2011 |
| CN | 202185669 | 4/2012 |
| CN | 102581320 | 7/2012 |
| DE | 1916881 | 6/1965 |
| DE | 2002156 | 8/1971 |
| DE | 8806453 | 10/1988 |
| DE | 9211696 | 3/1993 |
| GB | 1157968 | 7/1969 |
| JP | S5039412 | 4/1975 |
| JP | S55152327 | 11/1980 |
| JP | S56131084 | 10/1981 |
| JP | S62137671 | 8/1987 |
| JP | H0728559 | 1/1995 |
| JP | 2005224838 | 8/2005 |
| JP | 2008125733 | 6/2008 |
| KR | 1020070005893 | 1/2007 |
| WO | 2008106419 | 9/2008 |

OTHER PUBLICATIONS

International Search Report from PCT application No. PCT/US2013/058101 dated Apr. 30, 2014, 14 pgs.

International Search Report from PCT application No. PCT/US2013/058104 dated Apr. 30, 2014, 14 pgs.

International Search Report from PCT application No. PCT/US2013/058106 dated Jan. 27, 2014, 9 pgs.

* cited by examiner

WELDING SYSTEM PANELS

CROSS-REFERENCE TO RELATED APPLICATIONS

This application claims priority from and the benefit of U.S. Provisional Application Ser. No. 61/697,998, entitled "WELDING SYSTEM WITH ERGONOMICALLY INTEGRATED RECESSED HANDLE," filed Sep. 7, 2012, U.S. Provisional Application Ser. No. 61/698,020, entitled "WELDING SYSTEM PANELS," filed Sep. 7, 2012, U.S. Provisional Application Ser. No. 61/698,027, entitled "WELDING SYSTEM WITH MULTI-POINT CONTACT LIFT EYE," filed Sep. 7, 2012, U.S. Provisional Application Ser. No. 61/698,060, entitled "WELDING SYSTEM WITH TERMINAL COVER PIECE," filed Sep. 7, 2012, each of which is hereby incorporated by reference in its entirety for all purposes.

BACKGROUND

The present invention relates generally to the field of welding systems, and more particularly to a welding system having a multi-position lifting mechanism, integrated recessed handles, a louvered front panel with a sliding cover piece, an enclosure formed from multiple panels, or some combination of these.

Welding systems often need to be moved or relocated. As such, a welding system should incorporate a mechanism that facilitates lifting of the welding system. Current welding systems may include only a single lifting mechanism with limited functionality. This single lifting mechanism is also insufficient for instances when it may be desirable to move a welding system without having to lift it off the ground. For example, when an operator wants to slide or slightly readjust the position of the welding system, current welding systems have no ergonomic (e.g., easy to grab) grip locations. Being unable to securely grip the welding system may result in damage to the welding system and/or the operator.

Additionally, most welding system enclosures have exceedingly simple designs. Welding system enclosures generally incorporate a cover piece for the weld output terminals and exposed edges and/or seams between the panels used to form the enclosure. Particularly, the seams may have gaps between panels or overlapping panels and the cover piece may be fragile and may create an obstruction (e.g., get in the way) when not in place over the output connections. Additionally, the cover piece and the gaps/overlaps may detract from the aesthetics of the welding system.

BRIEF DESCRIPTION OF THE INVENTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In a first embodiment, a welding system includes an enclosure frame. The welding system also includes a side panel having a tab extending along a bottom edge of the side panel. The tab is configured to mate with a complementary slot in the enclosure frame.

In a second embodiment, a welding system includes an enclosure frame. The welding system also includes a side panel that creates a flush interface between the enclosure frame and the side panel when the side panel is secured to the enclosure frame.

In a third embodiment, a method includes placing a tab of a side panel into a slot of a welding system frame. The method also includes rotating the side panel inwardly until it abuts a rear panel of the welding system frame. The method further includes sliding the side panel toward a front panel assembly of the welding system frame until it abuts the front panel assembly.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

The embodiments described herein include improvements in the form of a welding system lifting mechanism (e.g., lift eye), and welding system enclosure. These improvements include a lift eye that may be disposed within a recess, and a welding system enclosure that includes ergonomic handles, sliding track, and side panels. Such improvements may, for example, enable operators to arrange the lift eye in multiple positions and/or relocate/reposition the welding systems via sliding. The embodiments described herein simplify the use of the welding system and decrease the possibility of damaging the welding system and/or the operator. Other benefits of the disclosed embodiments include protection for the internal components, the cover plate, and the electrical connections of the welding system. The improvements may increase the operability, durability, portability, accessibility, and aesthetics of the welding system as a whole.

Figure 1:
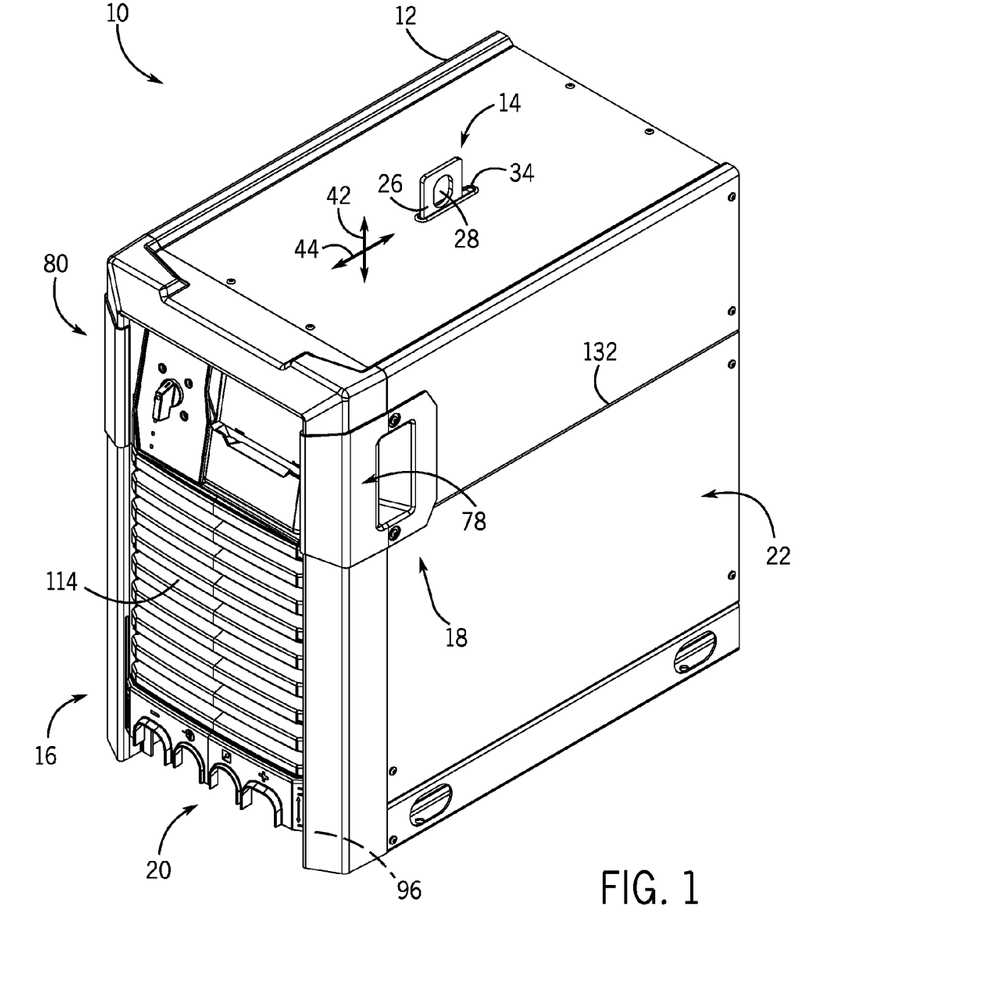
FIG. 1 is a perspective view of an embodiment of a welding system having a lifting mechanism and a welding system enclosure.

FIG. 1 is a perspective view of an embodiment of a welding system 10 having a lifting mechanism and a welding system enclosure. The welding system 10 may be used in any suitable welding configuration such as gas metal arc welding (GMAW), flux cored arc welding (FCAW), gas tungsten arc welding (GTAW), submerged arc welding (SAW), shielded metal arc welding (SMAW), carbon arc cutting-air (CAC-A), or similar arc welding processes. The welding system 10 is configured to provide welding power during performance of the welding processes. The welding system 10 includes a housing 12 that may incorporate a lifting mechanism 14 that may be used to connect the welding system 10 to a lifting machine such as a jack or hydraulic lift. The welding system 10 also includes a front panel assembly 16 that includes one or more handles 18 that may be ergonomically designed to allow comfortable repositioning of the welding system 10 by an operator. The front panel assembly 16 also includes a cover piece 20 that may be configured to aesthetically and durably protect the weld output connections (and other electrical connections) and other interior components of the weld system 10. The welding system 10 also includes side panels 22 that may be used to cover the exterior of the welding system 10, preventing foreign matter from contaminating the welding system 10, and protecting an operator of the welding system 10.

Figure 2:
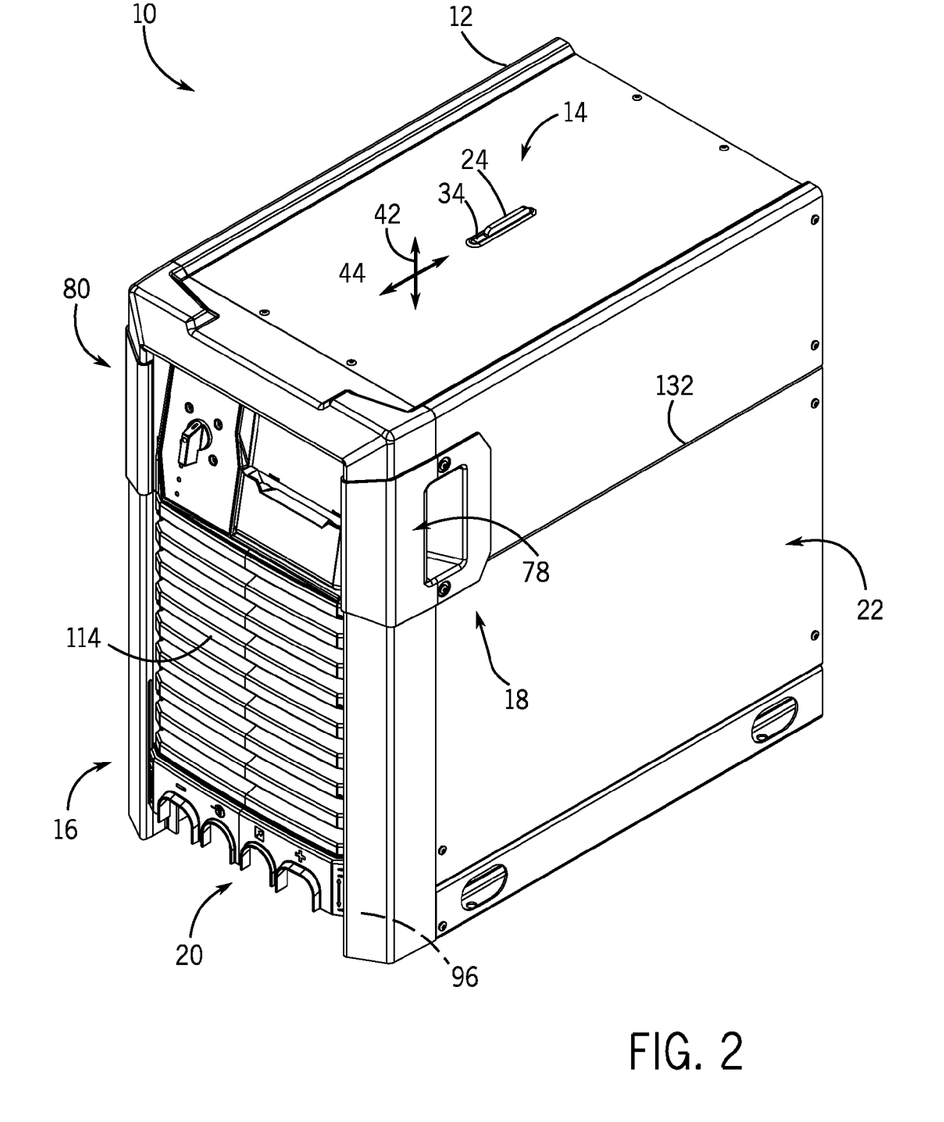
FIG. 2 is a perspective view of an embodiment of a welding system having the lifting mechanism of FIG. 1 in which the lifting mechanism is in a hidden position for use during operation of the welding system.

FIG. 2 is a perspective view of an embodiment of the welding system 10 having the lifting mechanism 14 of FIG. 1 in which the lifting mechanism 14 is in a hidden (e.g., fully retracted) position for use during operation of the welding system 10. The lifting mechanism 14 may include a lift eye 24 that may be incorporated within the housing 12 of the welding system 10 to provide an access point for machinery to lift the welding system 10 and relocate the welding system 10 as necessary. Further, the lift eye 24 may act as a positioning feature for the welding system 10 when additional components are placed on top of the welding system 10. For example, a welding wire feeder (not shown) may be placed on top of the welding system 10 and may use the lift eye 24 as a positioning reference. More specifically, a mating feature in the bottom of the welding wire feeder may align and mate with the lift eye 24 when it extends from the housing 12 of the welding system 10 (e.g., as illustrated in FIG. 1).

Figure 3:
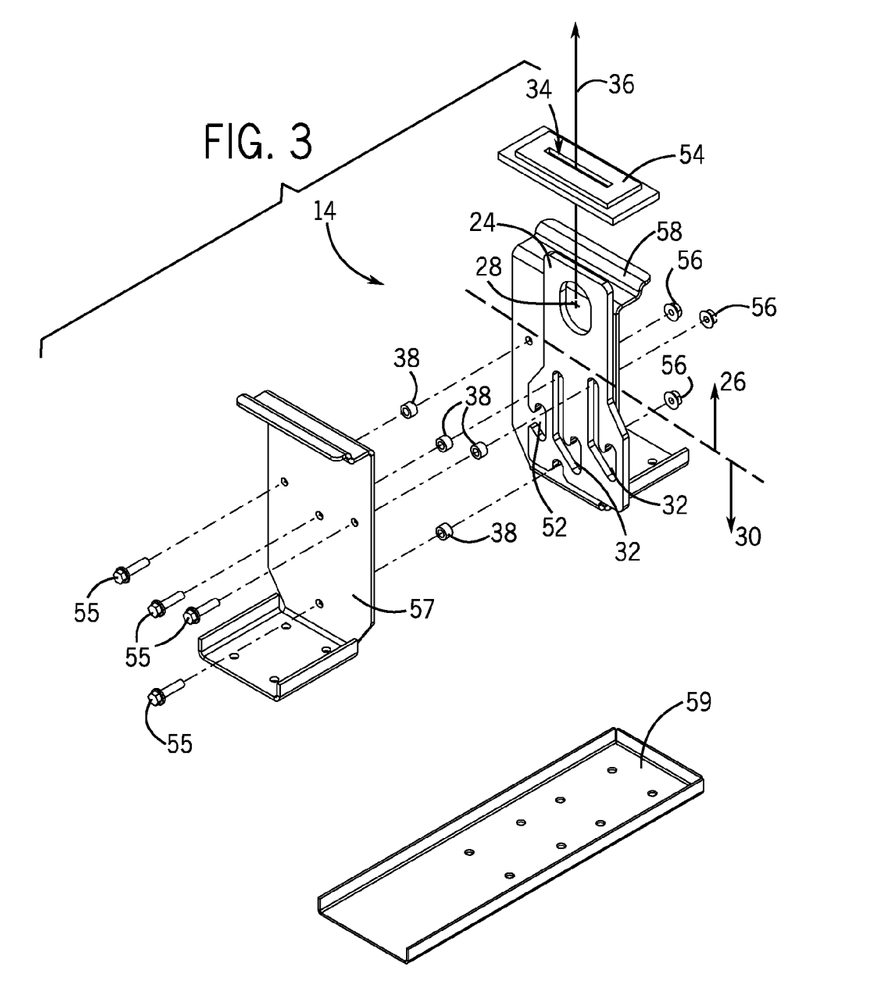
FIG. 3 is an exploded view of an embodiment of a lifting mechanism.

FIG. 3 is an exploded view of an embodiment of the lifting mechanism 14. When in use, a portion of the lift eye 24 may extend beyond the housing 12 of the welding system 10. The exposed portion 26 may contain a hole 28 (e.g., eye, see FIG. 1) for connecting the lift eye 24 to lifting machinery. The unexposed portion 30 (e.g., that does not extend outwardly from the housing 12) may contain a series of slots 32 to enable translation of the lift eye 24. When not in use, a majority of the lift eye 24 may reside in a recess 34 within the housing 12, such that it is not unnecessarily exposed or in the way of other components.

The lift eye 24 may have at least three possible positions, two resting positions and one lifting position. One resting position 50 (e.g., an alignment position) may include the lift eye 24 being slightly exposed, and the other resting position 40 (e.g., when there is a height restriction or for more desired aesthetics) may have the lift eye 24 retracted within the recess of the housing 12, wherein substantially all (e.g., approximately 95%, approximately 99%, or more) of the lift eye 24 is disposed within the housing 12 (see FIG. 2). The lifting position 60 may have the lift eye 24 fully extended outwardly from the recess 34. From either resting position (40, 50), an upward force 36 applied to the lift eye 24 may place the lift eye 24 in the lifting position 60. The upward force 36 may be evenly distributed within the lift eye 24 structure through the use of at least two slots 32 in combination with multiple cylindrical bearings 38 (see FIGS. 3 and 4). It is noted in FIG. 3 that two of four cylindrical bearings 38 are configured to fit within the slots 32, whereas all of the cylindrical bearings 38 are configured with respective screws 55 and associated nuts 56, which function to hold first and second interior mounting portions 57, 58 together about the lift eye 24. It will be appreciated that the first and second interior mounting portions 57, 58 are used to mount the lifting mechanism 14 within the housing 12 of the welding system 10.

Figure 4:
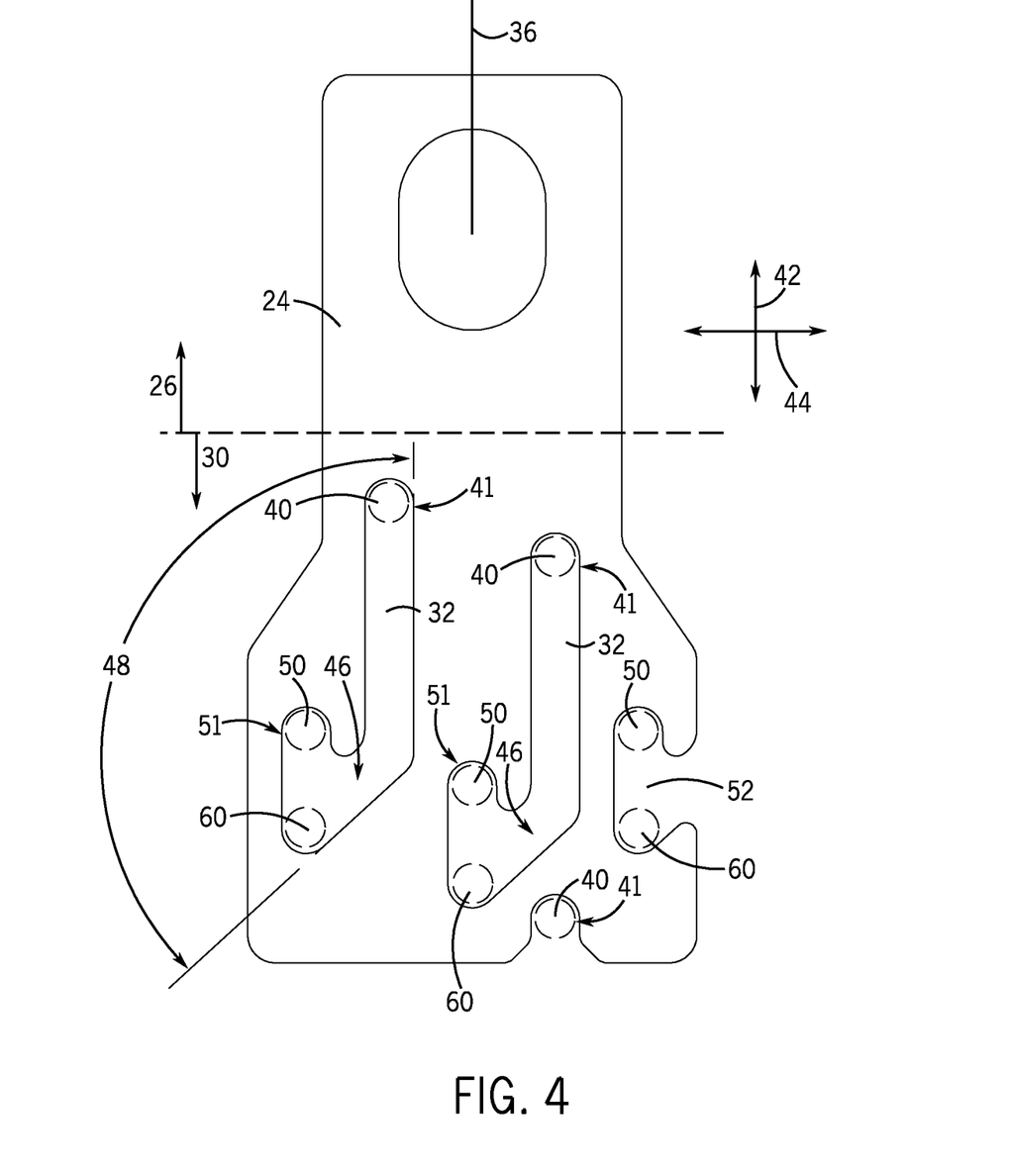
FIG. 4 is a cross-sectional side view of an embodiment of a lift eye that may be part of the lifting mechanism of FIGS. 1-3.

FIG. 4 is a cross-sectional side view of an embodiment of the lift eye 24 that may be part of the lifting mechanism 14 of FIGS. 1-3. The lift eye 24 may be in the retracted resting position 40 when the cylindrical bearings 38 are located at the top 41 of the slots 32. When an upward force 36 is applied, the lift eye 24 may be forced along the path formed by the slots 32 and the cylindrical bearings 38. The cylindrical bearings 38 may remain fixed while the lift eye 24 translates around the cylindrical bearings 38 in a vertical direction 42 and in a horizontal direction 44. The top portion 41 of the slots 32 (e.g., long vertical portion of the slot 32) may apply vertical translation, and the angled portion 46 of the slots 32 may additionally apply horizontal translation. In certain embodiments, the angled portion 46 of the slots 32 may be disposed at approximately 133° from the vertical axis 42, however, any angle 48 between approximately 90° and approximately 180° may be used (e.g., a range between approximately 125° and approximately 145° in certain embodiments). Small vertical slot portions 51 at the end of the angled portions 46 may be used to retain the lift eye 24 in the exposed resting position 50. This may provide a stable position to be used as a positioning reference for additional components (e.g., welding wire feeders, and other components) placed on top of the welding system 10. In certain embodiments, a third, shorter, side slot 52 may be used to ensure parallel orientation between the lift eye 24 and its recess 34 within the housing 12 of the welding system 10.

In order to enable both vertical 42 and horizontal 44 translation, the recess 34 in the housing 12 may be slightly larger than the lift eye 24. In certain embodiments, to prevent contaminants from entering the welding system 10 through the recess 34, a sliding seal 54 may be included adjacent the recess 34 (see FIG. 3). The seal 54 may be formed of a low-friction material and may fit tightly between the surface of the lift eye 24 and the surface of the recess 34. Further, in certain embodiments, at least one drain channel 59 may be included below the lift eye 24 to remove any liquid that may enter through the recess 34.

Figure 5:
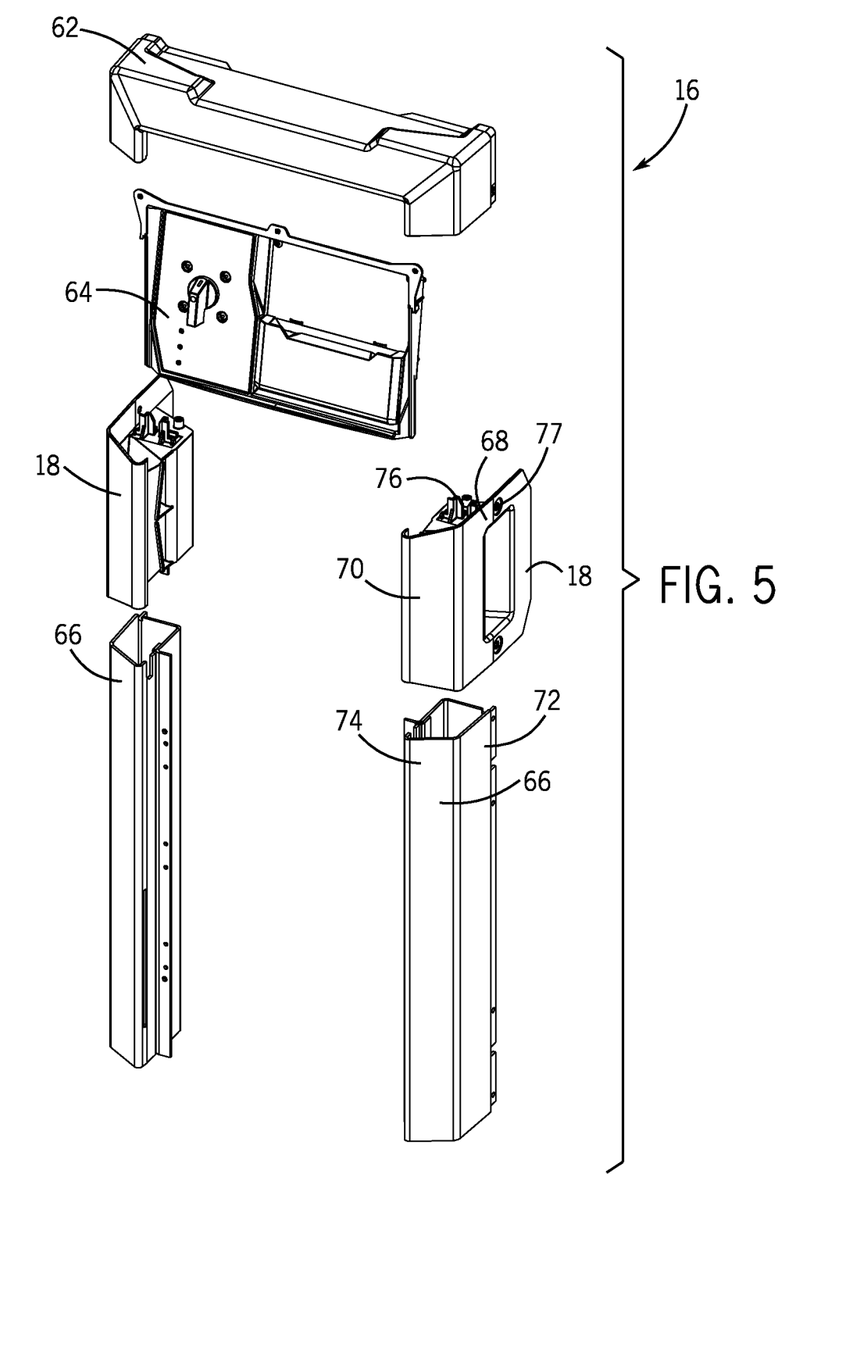
FIG. 5 is an exploded view of certain components of an embodiment of a front panel assembly of the welding system of FIG. 1.

FIG. 5 is an exploded view of certain components of an embodiment of the front panel assembly 16 of the welding system 10 of FIG. 1. The front panel assembly 16 includes a top frame member 62, a front panel 64, the recessed handles 18, and side frame members 66 of the welding system 10. Each component of the front panel assembly 16 may comprise more than one piece, or the separate pieces shown in FIG. 5 may be combined. For example, in certain embodiments, the top frame member 62 and the front panel 64 may be constructed as a single manufactured item. In other embodiments, the recessed handles 18 and the side frame members 66 may be constructed as a single manufactured item. In the illustrated embodiment, the recessed handles 18 are located between the top frame member 62 and the side frame members 66 and may enable an operator to relocate/reposition the welding system 10 with or without using machinery to lift the welding system 10. As such, the recessed handles 18 may provide a location for the operator to ergonomically grip the welding system 10. The recessed handles 18 may be incorporated into the housing 12 of the welding system 10 and may be recessed into the welding system 10.

Figure 6:
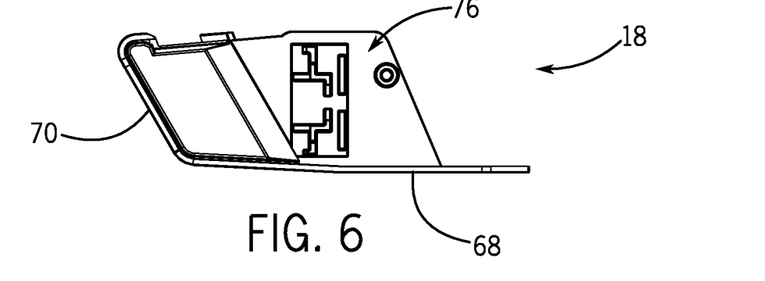
FIG. 6 is a top and/or bottom view of an embodiment of recessed handles.

FIG. 6 is a top and/or bottom view of the recessed handles 18. The recessed handles 18 include a side face 68 and an aesthetically pleasing angled face 70. Each face (68, 70) may match up with corresponding faces (72, 74) on the side frame members 66. Matching the recessed handles 18 with the side frame members 66 gives the welding system 10 a design that is pleasing to the eye and that integrates the design of the welding system 10. The recessed handles 18 also include internal tabs 76 that support and strengthen the recessed handles 18. For example, the recessed handles 18 may include between approximately two and approximately twenty internal tabs 76. The internal tabs 76 may secure the recessed handles 18 to the side frame members 66, the top frame member 62, the front panel 64, the housing 12, or a combination thereof. The internal tabs 76 also align the recessed handles 18 with the other components of the front panel assembly 16 and the welding system 10. In addition to providing rigidity for gripping, the internal tabs 76 may simplify the assembly of the recessed handles 18 onto the welding system 10.

Figure 7:
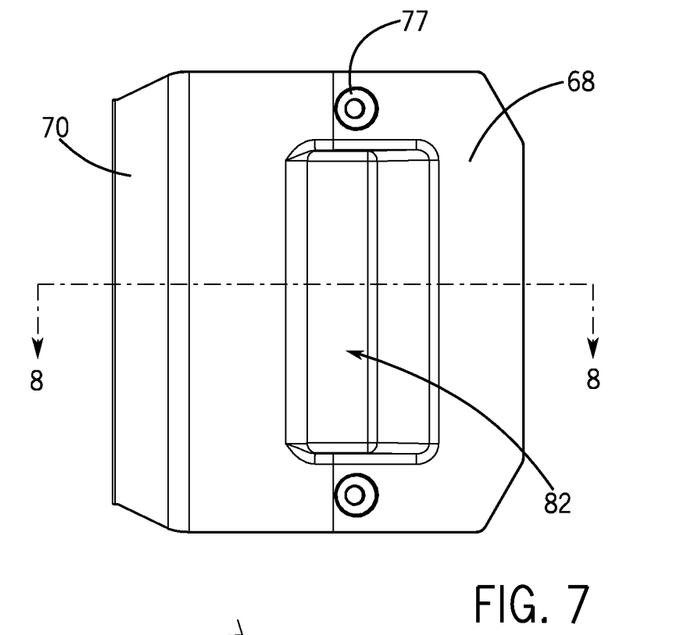
FIG. 7 is a side view of the recessed handle of FIG. 6.

FIG. 7 is a side view of the recessed handles 18 of FIG. 6. As illustrated, the recessed handles 18 may be generally symmetrical about line A-A. Symmetrical construction enables the recessed handles 18 to be constructed from a single part that may be installed on either side of the welding system 10. In certain embodiments, the recessed handles 18 may be coupled to the welding system 10 by fasteners 77 (e.g., nails, bolts, screws, pins, etc.). That is, referring back to FIG. 1, a recessed handle 18 may be installed on a left side 78 of the welding system 10 (facing out from the welding system 10) in the configuration shown in FIG. 7. Or, the same recessed handle 18 may be rotated 180° around the line A-A and installed on a right side 80 of the welding system 10, with the recessed handle 18 again toward the interior of the welding system 10. The recessed handle 18 includes a recess 82 which is configured to ergonomically fit to an operators hand while positioning or adjusting the welding system 10.

Figure 8:
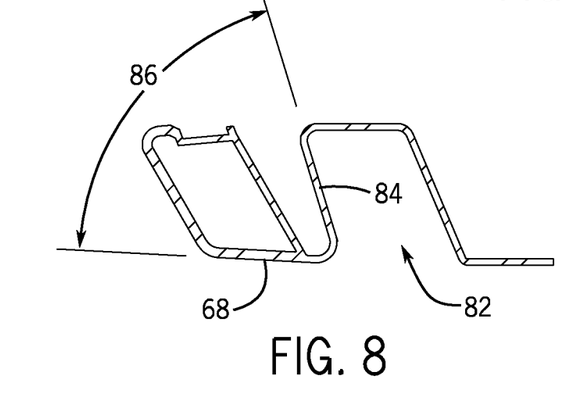
FIG. 8 is a cross-sectional view of the recessed handle along line 8-8 of FIG. 7.

FIG. 8 is a cross-section view of the recessed handles 18 along line 8-8 of FIG. 7. To provide an ergonomic grip while remaining recessed in the welding system, the recess 82 of the recessed handles 18 may be angled such that the operator's fingers may firmly grip a recessed angled portion 84. To ensure a comfortable grip, the angled portion 84 (e.g., inner wall) may be disposed at an angle 86 of approximately 70 degrees (see FIG. 3) from the side face 68 of the recessed handle 18, however, any other suitable angle 86 between approximately 60 degrees and approximately 80 degrees may be used. In some embodiments, the recessed handles 18 may be formed of plastic by a casting procedure. The casting procedure may enable the recessed handles 18, with the internal tabs 76, to be formed in a single step.

Figure 9:
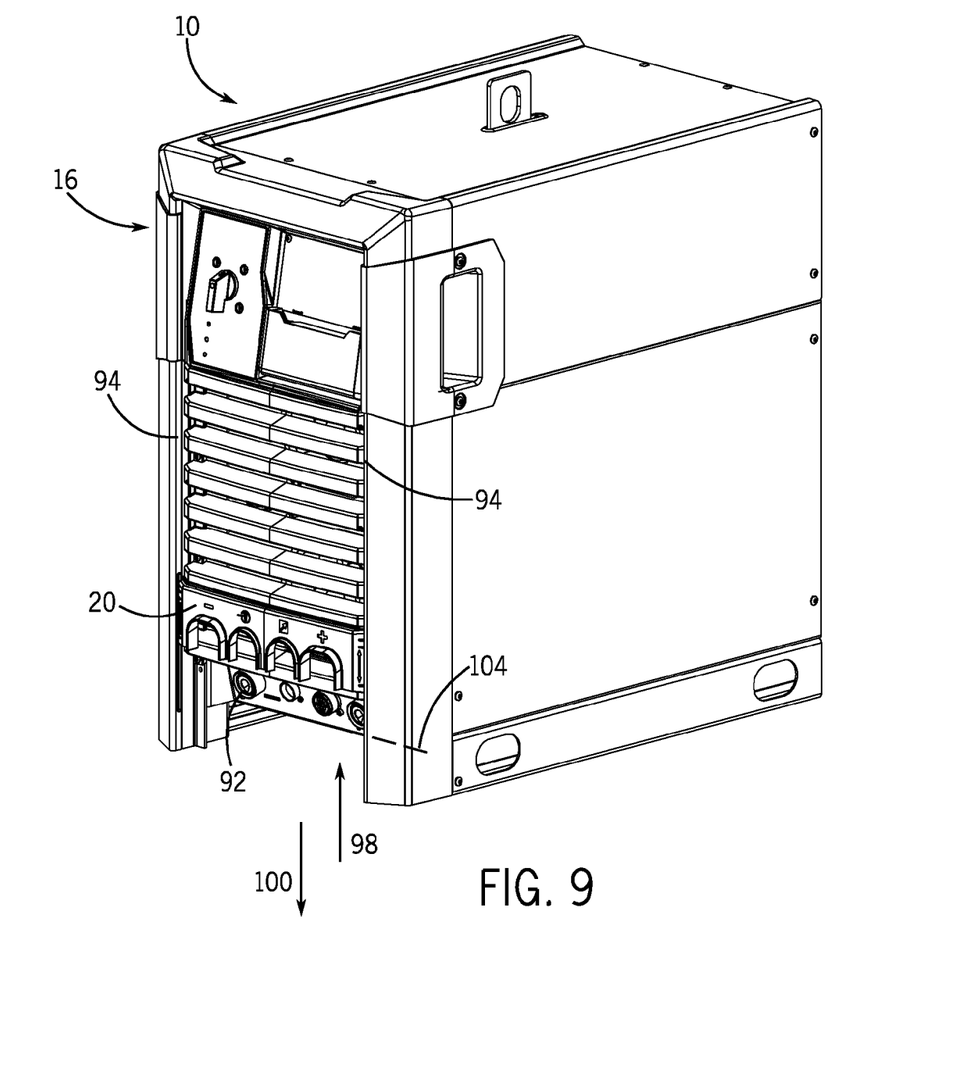
FIG. 9 is a detail view of an embodiment of a welding system having a sliding track.

FIG. 9 is a perspective view of an embodiment of the welding system 10 having a front cover piece 20. The cover piece 20 may slide within substantially parallel sliding tracks 94 in the front panel assembly 16 of the welding system 10. Referring back to FIG. 1, the cover piece 20 is located in a lowered (e.g., closed) position 96. In the lowered position 96, the cover piece 20 substantially covers the electrical connections 92 (e.g., weld output connections, and other electrical connections, such as feedback connections, and so forth) of the welding system 10. As such, the cover piece 20 may protect the operator from accidentally contacting the electrical connections 92. To reveal (e.g., entirely expose) the electrical connections 92, the cover piece 20 may slide upward 98 within the sliding tracks 94 in the front panel assembly 16. By sliding up 98 and down 100 within the tracks 94, the cover piece 20 remains securely coupled to the welding system 10 and does not create an obstruction for the operator using the welding system 10.

Figure 10:
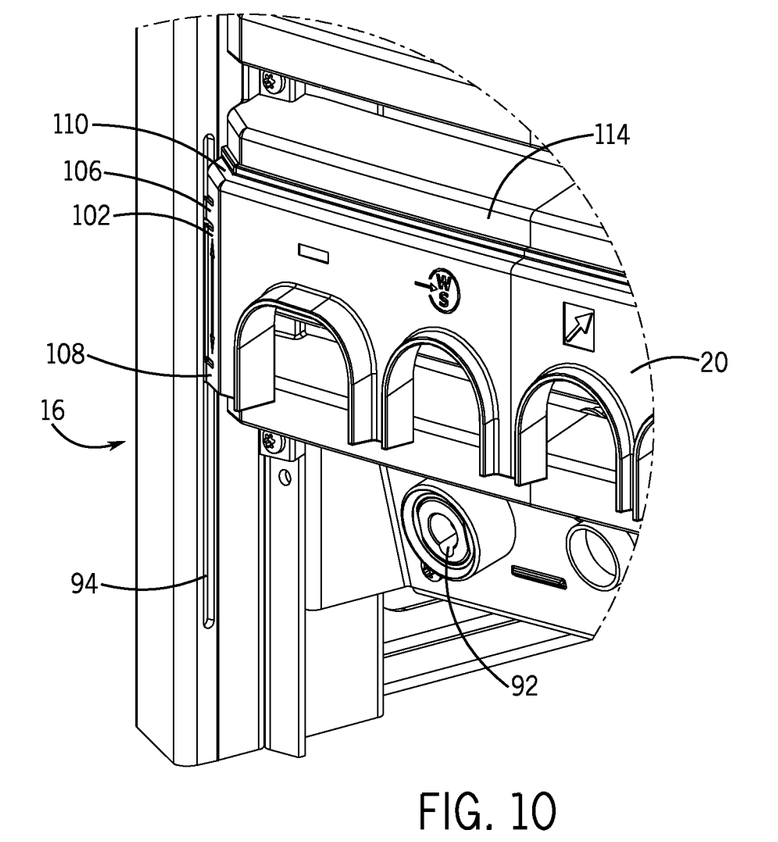
FIG. 10 is a perspective view of the embodiment of the welding system of FIG. 9.
Figure 12:
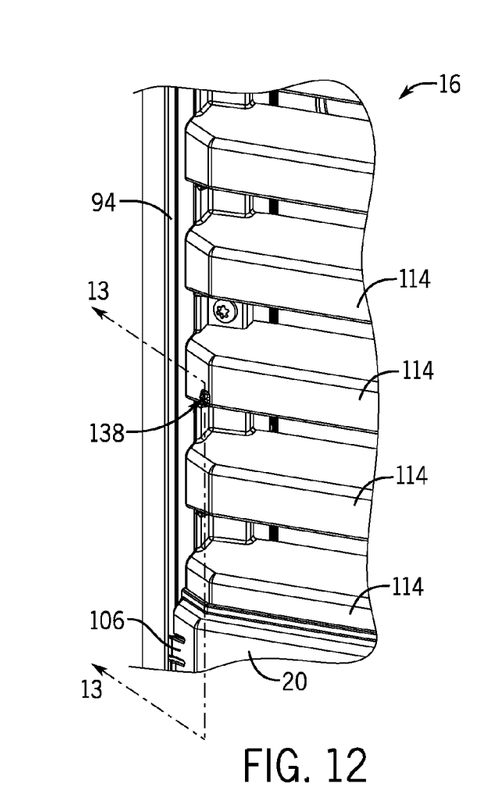
FIG. 12 is a perspective view of an embodiment of the front panel assembly, illustrating a detent of one of the louvers.
Figure 13:
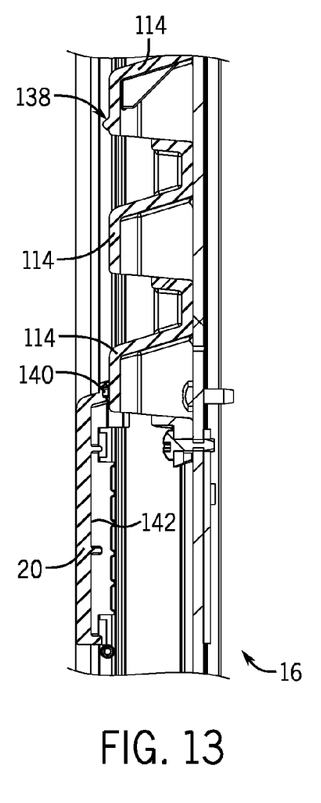
FIG. 13 is a cutaway side view of the embodiment of the front panel assembly of FIG. 12 taken along line 13-13, illustrating the detent in one of the louvers, and a mating indention in the cover piece.

FIG. 10 is a detail view of the embodiment of the welding system 10 of FIG. 9. To facilitate the sliding motion of the cover piece 20, the cover piece 20 may include a set of side tabs 102, 106, 108 on each side. The tabs 102, 106, 108 may fit within the sliding tracks 94 in the front panel assembly 16 of the welding system 10. Additionally, the tabs 102, 106, 108 may provide a snap-fit within the sliding tracks 94 to securely retain the cover piece 20 within the tracks 94 and prevent the cover piece 20 from being accidentally removed from the welding system 10. Once slid into the open position 104 (e.g., "up" position as illustrated in FIG. 9), a detent 138 protruding from one of the louvers 114 of the front panel assembly 16 may mate with a complementary indention 140 in a back wall 142 of the cover piece 20, thereby locking the cover piece 20 in the open position 104. FIG. 12 is a perspective view of an embodiment of the front panel assembly 16, illustrating the detent 138 of one of the louvers 114, and FIG. 13 is a cutaway side view of the embodiment of the front panel assembly 16 of FIG. 12 taken along line 13-13, illustrating the detent 138 in one of the louvers 114, and the mating indention 140 in the cover piece 20. Subsequently, as illustrated in FIG. 9, slight downward 100 pressure may unseat the detent 138 from the complementary indention 140, thereby facilitating sliding the cover piece 20 into the closed position 96 (as illustrated in FIG. 1).

Figure 11:
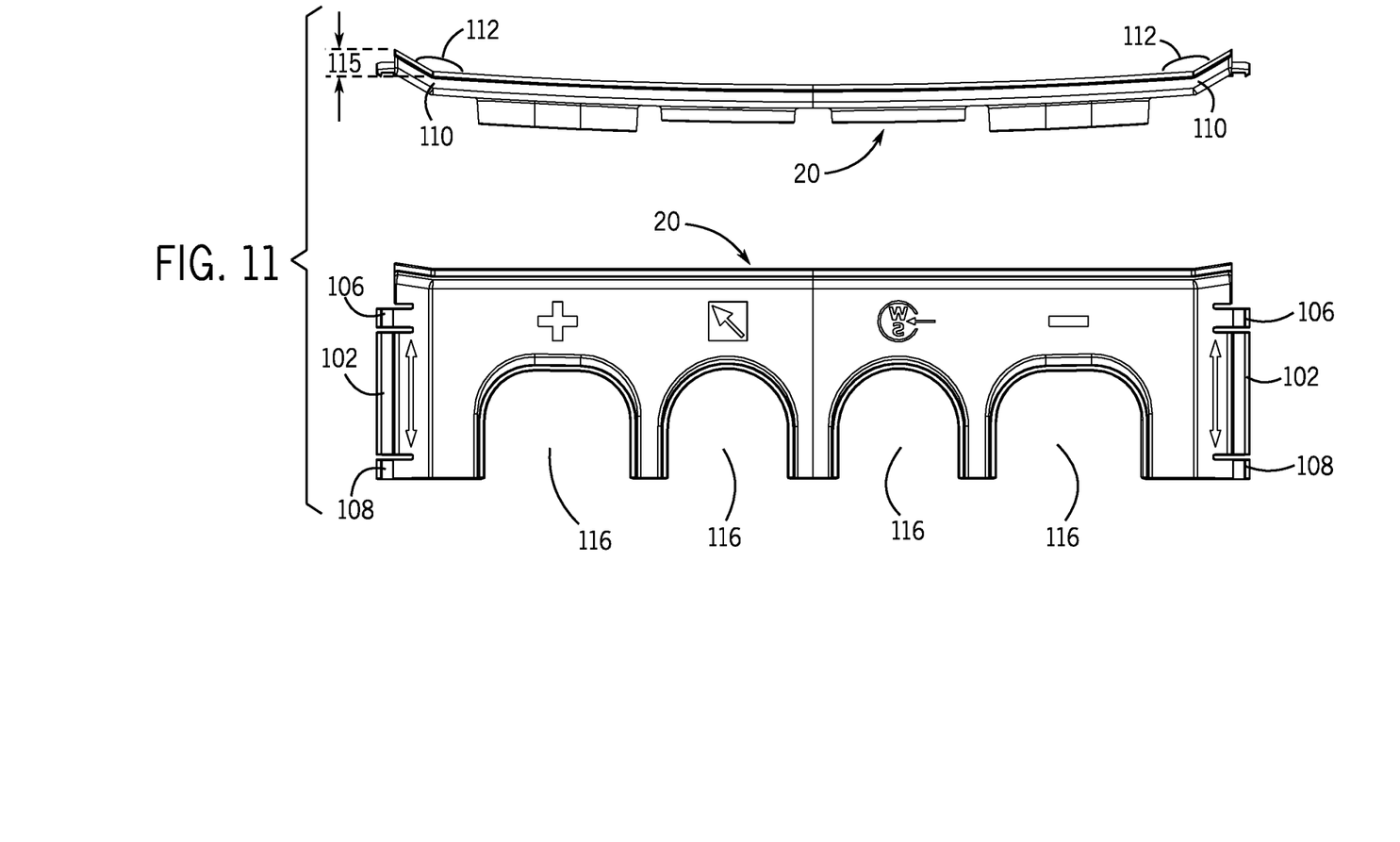
FIG. 11 is a top view and a front view of an embodiment of a cover piece that may slide on the sliding tracks of FIG. 9 and FIG. 10.

FIG. 11 is a top view and a front view of an embodiment of a cover piece 20 that may slide on the sliding tracks 94 of FIG. 9 and FIG. 10. The cover piece 20 includes the side tabs 102, top tabs 106 and bottom tabs 108. Furthermore, as shown in FIG. 11 the cover piece 20 may be contoured to prevent interference between the cover piece 20 and the welding system 10. Contour points 110 show the angle 112 of the contour that the cover piece 20 takes in order to provide a separation distance 115 between the cover piece 20 and the welding system 10. The cover piece 20 also provides aesthetic appeal to the welding system 10. In some embodiments, the front panel assembly 16 may be louvered (e.g., include a plurality of fan louvers 114 as illustrated in FIG. 1). The cover piece 20 may incorporate a complementary geometry. For example, the angle 112 of the contour of the cover piece 20 may be constructed to substantially match the contour of the louvers 114 of the front panel assembly 16. In addition, the cover piece 20 may include arched openings 116 that correspond to the electrical connections 92 through which weld cables (and other electrical cables) connected to the electrical connections 92 may be disposed when the cover piece 20 is slid into the closed position 96 (see FIG. 1). Further, the contours of the arched openings 116 may increase the aesthetic appeal of the welding system 10.

Figure 14:
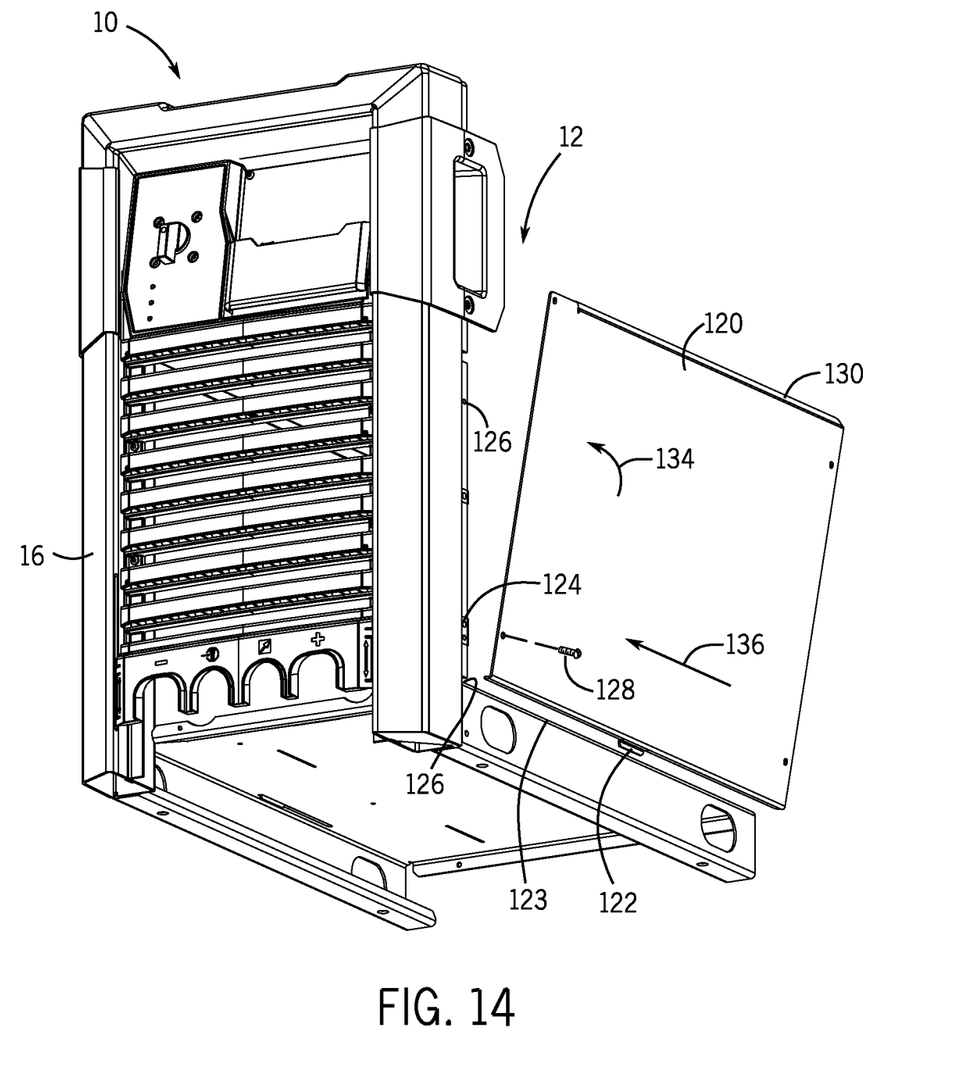
FIG. 14 is a perspective view of an embodiment of an enclosure having multiple sheet metal panels.

FIG. 14 is a perspective view of an embodiment of an enclosure having multiple sheet metal panels. The housing 12 of the welding system 10 may be formed from multiple sheet metal panels 118. For example, sheet metal panels 118 may be used to form side panels 120, a rear panel, and a top panel for the welding system enclosure. Each of the panels 118 may include tabs 122, depressions 124 (e.g., countersinks, counterbores, holes, tapped holes, etc.), slots 126, and/or other features to facilitate coupling the panels 118 to other components of the housing 12 (e.g., frame, front face, etc.). In certain embodiments, each side panel 120 may incorporate a tab 122 along its bottom edge (see FIG. 1). The tab 122 may mate with a complementary geometry in the frame of the housing 12 (e.g., an elongated slot 123) and may enable the side panel 120 to be coupled to the frame housing 12. Such tab/slot geometry may create even seams (e.g., smooth transitions and flush interfaces) between enclosure components, and may be utilized on any combination of panels 118 in the welding system enclosure. In other words, once the panels 118 are secured to the welding system enclosure, there are no protrusions extending from or indentions extending into the welding system enclosure at the seams.

The panels 118 may also contain depressions 124, such as countersinks, counterbores, and holes, to accommodate fasteners 128. The fasteners 128 may be used to attach the panels 118 to the housing 12 of the welding system 10. The depressions 124 may enable secure attachment of the panels 118 without warping or otherwise deforming or deflecting the panels 118. Further, the use of depressions 124 with fasteners 128 may also improve the seam quality of the enclosure. Improved seam quality may increase the aesthetic appeal of the welding system 10, and may prevent foreign particles from entering the housing 12.

The panels 118, particularly the side panels 120, may also include inwardly angled flanges 130 extending from an edge (e.g., a top edge) of the panels 118. Such flanges 130 may be overlapped by another panel of the housing 12. The overlapped flange 130 may form a gap-free seam 132 that provides a seal against foreign contaminants As such, the internal components of the welding system 10 may be protected against particulates, thereby improving the reliability of the welding system 10. Further, the welding system 10 may have increased aesthetic appeal due to minimized gaps and overlapping between panels 118. The use of edge flanges 130 may also result in reinforced edges and seams, improving the durability of the enclosure. Such a flange 130 may be incorporated on any edge, or combination of edges, on a panel or multiple panels 118.

Forming the housing 12 of the welding system 10 from individual panels 118 may also simplify the assembly process of the housing 12. For example, operators may use simple/standard tools to assemble the housing 12. The use of simple tools may result in time savings, cost savings, and reduced operator training For example, the use of the tab/slot geometry may enable the side panels 120 to be simply rotated into place and secured with fasteners 128. In one embodiment, the assembly method may include: coupling a rear panel to the frame, placing a tab 122 of each side panel 120 into a slot in the frame, rotating each side panel 120 inward (e.g., as illustrated by arrow 134) until it abuts the rear panel, sliding each side panel 120 horizontally toward the front of the housing 12 (e.g., as illustrated by arrow 136) until it abuts the front panel assembly 16 of the housing 12, placing a top panel to complete the enclosure, and securing the panels 120 with fasteners 128. A fully assembled welding system enclosure is shown in FIG. 1.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A welding system, comprising:
an enclosure frame that encompasses internal components configured to provide welding power during performance of a welding process; and
a side panel comprising one or more apertures, each configured to receive a fastener for coupling the side panel to the enclosure frame, and a single tab extending outward from a bottom edge of the side panel, lengthwise along the bottom edge of the side panel, wherein the single tab is configured to engage with an elongated slot extending lengthwise along a bottom member of the enclosure frame, wherein the side panel is configured to slide laterally along the elongated slot toward a front member of the enclosure frame to install the panel, wherein the side panel comprises an inwardly angled flange extending along a top edge of the side panel, wherein the inwardly angled flange is configured to mate with a top panel to form a gap-free seam that provides a seal against foreign contaminants, such that the side panel forms flush interfaces and smooth transitions with both the top panel and the enclosure frame when the single tab of the side panel mates with the elongated slot in the enclosure frame.

2. The welding system of claim 1, wherein the side panel abuts a front panel assembly when slid into place with respect to the enclosure frame.

3. The welding system of claim 1, comprising first and second recessed handles disposed on opposite sides of the enclosure frame.

4. The welding system of claim 1, comprising a lifting mechanism disposed within a recess in the enclosure frame, wherein the lifting mechanism includes a lifting position that facilitates lifting of the enclosure frame, an alignment position that facilitates alignment of an external welding component with the enclosure frame, and a retracted position.

5. The welding system of claim 2, wherein the front panel assembly comprises a cover piece configured to slide with respect to the front panel assembly to facilitate connection access to electrical connections.

6. The welding system of claim 2, wherein the side panel abuts a rear panel when slid into place with respect to the enclosure frame.

7. A welding system, comprising:
an enclosure frame that encompasses internal components configured to provide welding power during performance of a welding process; and
a side panel that creates a flush interface between the enclosure frame and the side panel when the side panel is secured to the enclosure frame, wherein the side panel comprises one or more apertures, each configured to receive a fastener for coupling the side panel to the enclosure frame, and a single tab extending outward from a bottom edge of the side panel, lengthwise along the bottom edge of the side panel, and configured to engage with and slide horizontally with respect to an elongated slot extending lengthwise along a bottom member of the enclosure frame toward a front member of the enclosure frame to secure the side panel to the enclosure frame, wherein the side panel comprises an inwardly angled flange extending along a top edge of the side panel, and the inwardly angled flange is configured to mate with a top panel to form a gap-free seam that provides a seal against foreign contaminants, such that the side panel forms flush interfaces and smooth transitions with both the top panel and the enclosure frame when the single tab of the side panel mates with the elongated slot in the enclosure frame.

8. The welding system of claim 7, wherein the side panel abuts a front panel assembly when slid into place with respect to enclosure frame.

9. The welding system of claim 7, comprising first and second recessed handles disposed on opposite sides of the enclosure frame.

10. The welding system of claim 7, comprising a lifting mechanism disposed within a recess in the enclosure frame, wherein the lifting mechanism includes a lifting position that facilitates lifting of the enclosure frame, an alignment position that facilitates alignment of an external welding component with the enclosure frame, and a retracted position.

11. The welding system of claim 8, wherein the front panel assembly comprises a cover piece configured to slide with respect to the front panel assembly to facilitate connection access to electrical connections.

* * * * *